(12) United States Patent
Yang et al.

(10) Patent No.: US 8,014,203 B2
(45) Date of Patent: Sep. 6, 2011

(54) MEMORY DEVICE AND METHODS FOR FABRICATING AND OPERATING THE SAME

(75) Inventors: I-Chen Yang, Hsinchu (TW); Yao-Wen Chang, Hsinchu (TW); Tao-Cheng Lu, Hsinchu (TW); Guan-Wei Wu, Hsinchu (TW); Tao-Yuan Lin, Hsinchu (TW); Po-Chou Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 115 days.

(21) Appl. No.: 12/614,647

(22) Filed: Nov. 9, 2009

(65) Prior Publication Data

US 2010/0302855 A1    Dec. 2, 2010

Related U.S. Application Data

(63) Continuation-in-part of application No. 12/471,660, filed on May 26, 2009.

(51) Int. Cl.
*G11C 16/04* (2006.01)

(52) U.S. Cl. ............... 365/185.18; 365/185.27; 257/314; 257/315; 257/E21.423; 257/E29.309; 438/268

(58) Field of Classification Search .................. None
See application file for complete search history.

(56) References Cited

U.S. PATENT DOCUMENTS

| 6,917,069 B2 * | 7/2005 | Kianian et al. ............... 257/315 |
| 7,697,328 B2 * | 4/2010 | Forbes ..................... 365/185.03 |
| 2007/0093023 A1 * | 4/2007 | Wu ............................. 438/257 |

* cited by examiner

*Primary Examiner* — Tan T. Nguyen
(74) *Attorney, Agent, or Firm* — J.C. Patents

(57) ABSTRACT

The memory device is described, which includes a substrate, a conductive layer, a plurality of charge storage layers and a plurality of doped regions. The substrate has a plurality of trenches formed therein. The conductive layer is disposed on the substrate and fills the trenches. The charge storage layers are disposed between the substrate and the conductive layer in the trenches respectively, wherein the charge storage layers are separated from each other. The doped regions are configured in the substrate under bottoms of the trenches, respectively.

31 Claims, 14 Drawing Sheets

MEMORY DEVICE AND METHODS FOR FABRICATING AND OPERATING THE SAME

CROSS-REFERENCE TO RELATED APPLICATION

This application is a continuation-in-part application of patent application Ser. No. 12/471,660, filed on May 26, 2009, now pending. The entirety of the above-mentioned patent application is hereby incorporated by reference herein and made a part of specification.

BACKGROUND OF THE INVENTION

1. Field of the Invention

The present invention generally relates to a semiconductor device. More particularly, the present invention relates to a memory device, and to a fabricating method and an operating method of the same.

2. Description of Related Art

A memory is a semiconductor device designed for storing info nation or data. As the functions of computer microprocessors become more and more powerful, programs and operations executed by software are increasing correspondingly. Consequentially, the demand for high storage capacity memories is getting more. Among various types of memory products, a non-volatile memory allows multiple-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures known as electrically erasable programmable read-only memory (EEPROM) and flash memory are used in a variety of modern applications. A typical flash memory is designed with an array of memory cells that can be independently programmed and read. The conventional flash memory cells store charge on a floating gate. When the memory is programmed, the electrons injected into the floating gate uniformly distributes in the polysilicon layer. However, when there are defects in the tunnel oxide layer under the polysilicon floating gate, the leakage is easily produced in the device. Hence, the reliability of the device is compromised.

Another type of the flash memory uses a charge-trapping structure, such as a layer of non-conductive SiN material, rather than the conductive gate material used in floating gate devices. When a charge-trapping cell is programmed, the charge is trapped and does not move through the non-conductive layer. The charge is retained by the charge-trapping layer until the cell is erased, retaining the data state without continuously applied electrical power. In addition, the electrons are only stored in a portion of the charge-trapping layer over the channel region adjacent to a source or drain region when the device is programmed. Because the charge does not move through the non-conductive charge-trapping layer, the charge can be localized on different charge-trapping sites.

Conventionally, there are two separated storage sites in a memory cell with planar channel, which is considered as a 2-bit-per-cell memory device shown in FIG. 1. The only way for increasing storage density is achieved by scaling the cell length of the planar channel cell. When the cell length is scaled down, the planar channel cell with demanded shallow junctions is prone to worse programming disturbance and higher resistance of the source and drain regions. As the cell is miniaturized, electrons stored in adjacent two bits are liable to merge due to the shrunk length, so that the second bit effect is getting worse. Moreover, as shown in FIG. 1, in the programming progress of channel hot electron injection (CHEI), redirection collision is required to send the electron toward a charge-trapping site 100 in the storage layer. Such redirection affects injection efficiency, and thereby higher voltage of about 7.5~11.5V is required for the $V_g$ applied to the gate.

SUMMARY OF THE INVENTION

Accordingly, the present invention is directed to a memory device that is capable of improving gate controllability and alleviating the second bit effect sufficiently.

The present invention is also directed to a method for fabricating a memory device with separated charge storage layers.

The present invention is still directed to a method for operating a memory device, in which programming efficiency is effectively enhanced.

To achieve these and other advantages and in accordance with the purpose of the invention, as embodied and broadly described herein, the invention provides a memory device. The memory device includes a substrate, a conductive layer, a plurality of charge storage layers and a plurality of doped regions. The substrate has a plurality of trenches formed therein. The conductive layer is disposed on the substrate and fills the trenches. The charge storage layers are disposed between the substrate and the conductive layer in the trenches respectively, wherein the charge storage layers are separated from each other. The doped regions are configured in the substrate under bottoms of the trenches, respectively.

According to an embodiment of the present invention, the charge storage layers are only disposed on surfaces of the trenches respectively.

According to an embodiment of the present invention, the charge storage layers further extend in the conductive layer above the substrate.

According to an embodiment of the present invention, the trenches include sloped sidewalls.

According to an embodiment of the present invention, an extending direction of the bottoms of the trenches and the sloped sidewalls form an included angle within a range of 45° to 75°.

According to an embodiment of the present invention, a vertical depth of each of the trenches is substantially within a range of 250 angstroms to 350 angstroms.

According to an embodiment of the present invention, the doped regions extend from the bottoms of the trenches to respective sidewalls of each of the trenches respectively.

According to an embodiment of the present invention, a junction of each of the doped regions is apart from a surface of the substrate within a range of 100 angstroms to 200 angstroms.

According to an embodiment of the present invention, the memory device further includes a gate dielectric layer, disposed on a surface of the substrate between two adjacent trenches. The gate dielectric layer may further extend in the conductive layer above the trenches.

According to an embodiment of the present invention, the memory device further includes a buried channel, configured in the substrate between two adjacent trenches. The buried channel is, for example, a lightly doped region, wherein a dopant dosage of the buried channel is substantially within a range of $3e16$ $cm^{-3}$ to $3e17$ $cm^{-3}$. A vertical depth of the buried channel can be substantially within a range of 50 angstroms to 150 angstroms.

According to an embodiment of the present invention, the memory device further includes a bottom dielectric layer and a top dielectric layer. The bottom dielectric layer is disposed between each of the charge storage layers and the substrate. The top dielectric layer is disposed between each of the charge storage layers and the conductive layer.

The method for fabricating the memory device of the present invention is described as follows. A substrate is provided. Followed a well region or that combined with a buried channel region is formed. A plurality of trenches is then formed in the substrate. A plurality of doped regions is formed in the substrate under bottoms of the trenches, respectively. A plurality of charge storage layers is formed conformally on surfaces of the trenches, respectively. The charge storage layers are separated from each other. A conductive layer is formed on the substrate, wherein the conductive layer fills the trenches.

According to an embodiment of the present invention, wherein the step of forming the trenches and the step of forming the doped regions may include following steps. A pattern layer is formed on the substrate. A portion of the substrate is removed using the pattern layer as a mask to form the trenches, wherein the trenches include sloped sidewalls. The doped regions are formed in the substrate using the pattern layer as a mask.

According to an embodiment of the present invention, the method for fabricating the memory device may further include following steps. Spacers are formed on sidewalls of the pattern layer, wherein the spacers cover the sloped sidewalls, and the doped regions are formed by using the pattern layer and the spacers as the mask. The pattern layer and the spacers are removed. A charge storage material layer is conformally formed on the substrate. A portion of the charge storage material layer disposed on a surface of the substrate between two adjacent trenches is removed, so as to form the charge storage layers separated from each other. A gate dielectric layer is formed on the surface of the substrate between two adjacent trenches. The gate dielectric layer may further extend in the conductive layer above the trenches.

According to an embodiment of the present invention, the method for fabricating the memory device may further include following steps. Spacers are formed on sidewalls of the pattern layer, wherein the spacers cover the sloped sidewalls, and the doped regions are formed by using the pattern layer and the spacers as the mask. The spacers are then removed. A charge storage material layer is conformally formed on the substrate and on the pattern layer. A portion of the charge storage material layer disposed on a top surface of the pattern layer is removed, so as to form the charge storage layers remaining on respective sidewalls of the pattern layer. The pattern layer can be made of conductor. The charge storage material layer is, for example, formed after the doped regions are formed. Before forming the pattern layer, the method for fabricating the memory device may further include forming a gate dielectric layer between the pattern layer and the substrate.

According to an embodiment of the present invention, the method for fabricating the memory device may further include following steps. A charge storage material layer is conformally formed on the substrate and on the pattern layer. A portion of the charge storage material layer disposed on a top surface of the pattern layer is then removed, so as to form the charge storage layers remaining on respective sidewalls of the pattern layer. The pattern layer can be made of conductor, and the doped regions are formed after the charge storage material layer is formed, for instance. Before forming the pattern layer, the method for fabricating the memory device may further include forming a gate dielectric layer between the pattern layer and the substrate.

According to an embodiment of the present invention, the method for fabricating the memory device may further include forming a buried channel, e.g. a lightly doped region, in the substrate between two adjacent trenches.

According to an embodiment of the present invention, the method for fabricating the memory device may further include following steps. A bottom dielectric layer is formed between the charge storage layer and the substrate. A top dielectric layer is formed between the charge storage layer and the conductive layer.

The method for operating the memory device of the present invention is described as follows. The memory device mentioned above includes a plurality of memory cells. Each memory cell includes a first bit and a second bit mirror-systematically configured in the charge storage layers respectively neighboring to the junctions of two adjacent doped regions on sidewalls of two adjacent trenches. A channel region is configured between the first bit and the second bit. The operating method include following steps. When performing a programming operation, a first voltage is applied to the conductive layer, a second voltage is applied to a doped region adjacent to the first bit, a third voltage is applied to another doped region adjacent to the second bit, and a fourth voltage is applied to the substrate. The first voltage is higher than the fourth voltage, and the second voltage is higher than the third voltage. A carrier is then accelerated to directly inject into the first bit through the channel region.

According to an embodiment of the present invention, the first voltage is about 5.5 V to 7.5 V, the second voltage is about 3.5 V to 5.5 V, the third voltage is about 0 V, and the fourth voltage is about 0 V.

As mentioned above, the memory device in the present invention includes the separate charge storage layers and the thinner gate dielectric layer above the channel region. Accordingly, gate controllability can be well improved, and the second bit effect and program disturbance are mitigated as well. In addition, since the recessed doped regions extend to the sidewalls of the trenches, the bits are configured on the sidewalls of the trenches apart from the surface of the substrate so that an effective channel length can be elongated.

Moreover, the method for fabricating the memory device in the present invention forms the separated charge storage layers respectively in the trenches and a single layer of gate dielectric layer above the planar channel region. Hence, the memory device to be formed is favorable for better AC and DC performances of a scaled cell.

Furthermore, the method for operating the memory device in the present invention stores electrons into the respective bits on the sidewalls of the trenches for programming each memory cell. Thus, the electrons accelerated by channel potential are directly injected into the charge storage layer on the sidewall of the trench without energy loss for redirection, such that programming efficiency can be remarkably improved.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
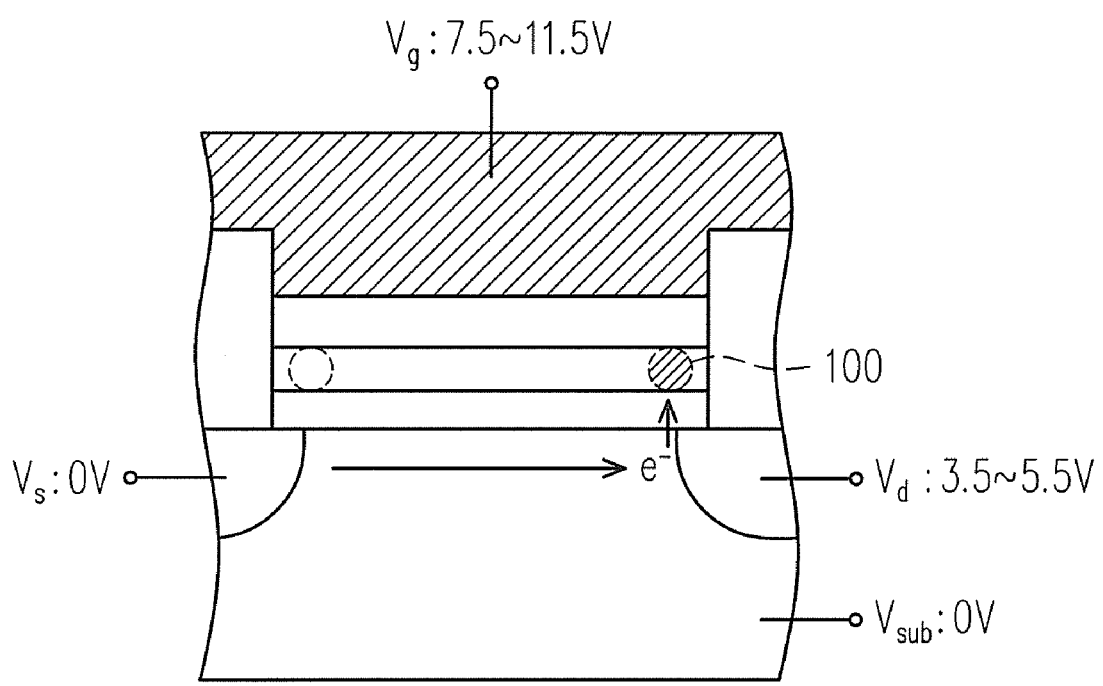
FIG. 1 is a cross-sectional view schematically illustrating a programming operation of a conventional planar channel memory cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
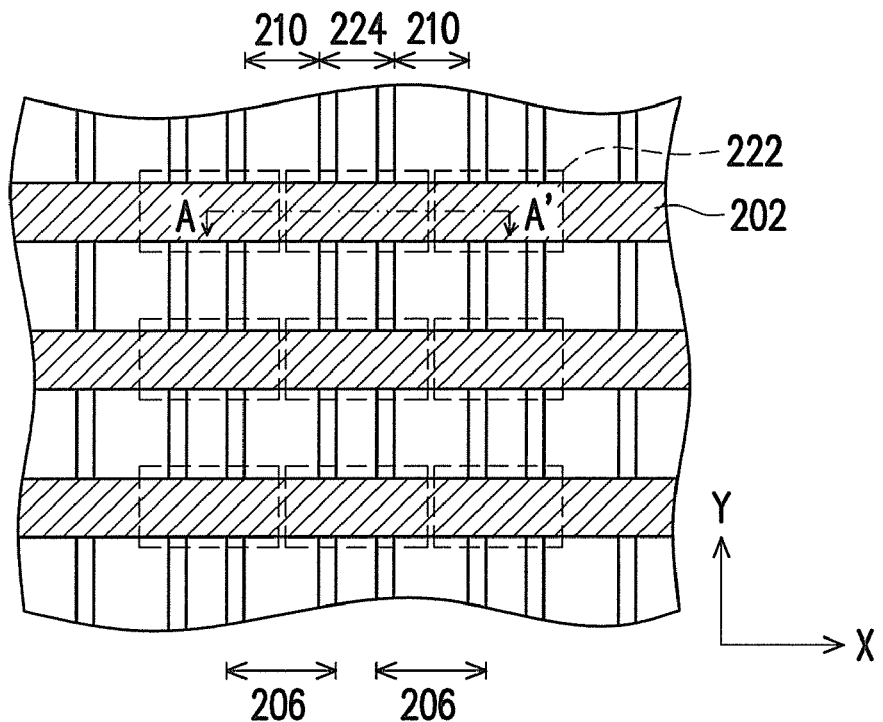
FIG. 2A schematically illustrates a top view layout of the memory device according to an embodiment of the present invention.
Figure 2B:
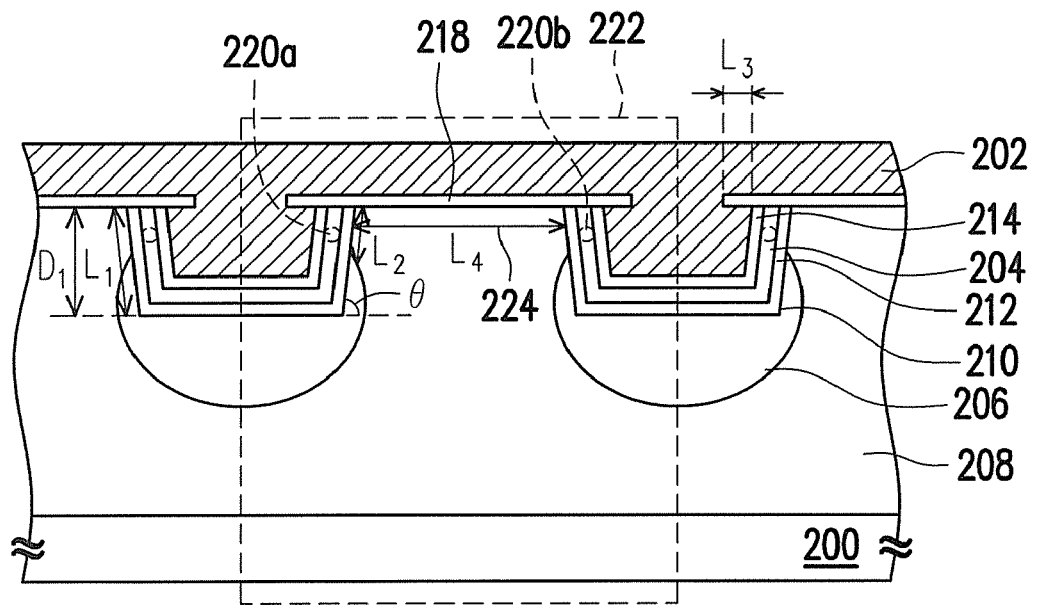
FIG. 2B is a schematic, cross-sectional diagram of the memory device shown in FIG. 2A along line A-A' according to an embodiment of the present invention.

FIG. 2A schematically illustrates a top view layout of the memory device according to an embodiment of the present invention. FIG. 2B is a schematic, cross-sectional diagram of the memory device shown in FIG. 2A along line A-A' according to an embodiment of the present invention.

Referring to FIGS. 2A and 2B concurrently, the memory device in an embodiment of the present invention includes a substrate 200, a conductive layer 202, a plurality of charge storage layers 204, and a plurality of doped regions 206. The substrate 200 may be a P-type or an N-type silicon substrate, a P-type or an N-type epi-silicon substrate or a P-type or an N-type semiconductor-on-insulator (SOI) substrate. A well region 208 is configured in the substrate 200. In an embodiment, when the device is an n-channel device, the well region 208 can be a P-well; when the device is a p-channel device, the well region 208 can be an N-well.

The substrate 200 has a plurality of trenches 210 formed therein. These trenches 210 are arranged in parallel to each other and disposed extensively in Y-direction. The trenches 210 are shallow trenches, for instance. In an embodiment, a vertical depth $D_1$ of each trench 210 is substantially within a range of 250 angstroms to 350 angstroms. Each trench 210 may have sloped sidewalls for a better diffusion profile of the doped regions 206 nearby the corners of the trenches 210. In an embodiment, an extending direction of a bottom of each trench 210 and the sloped sidewall thereof form an included angle θ within a range of 45° to 75°, and a length $L_1$ of the sloped sidewall is substantially within a range of 350 angstroms to 500 angstroms.

The conductive layer 202 is disposed on the substrate 200 and fills the trenches 210, and serves as a gate. The conductive layer 202 can be made of doped polysilicon, metal, or a combination of polysilicon and metal. The conductive layer 202 is, for example, arranged in a bar layout and extends in X-direction. The conductive layer 202 can connect a plurality of memory cells in line as separate word lines.

The charge storage layers 204 are disposed between the conductive layer 202 and the substrate 200 in the trenches 210, respectively. It is noted that the charge storage layers 204 are separated from each other. As shown in FIG. 2B, the charge storage layers 204 are only disposed on the surfaces of the trenches 210 respectively, while the substrate 200 between two adjacent trenches 210 is not covered by any charge storage layers 204. The material of the charge storage layer 204 includes charge-trapping materials, e.g. silicon nitride or silicon-rich nitride.

In an embodiment, a bottom dielectric layer 212 can be further disposed under each charge storage layer 204, and a top dielectric layer 214 can be disposed on each charge storage layer 204, so as to faun a complex dielectric layer. The bottom dielectric layers 212 are, for example, disposed between the charge storage layers 204 and the substrate 200, respectively. Each bottom dielectric layer 212 may be a dielectric material in the form of a single-layer structure, such as a low-K material (e.g. silicon oxide) or a high-K material (e.g. HfAlO). Alternatively, each bottom dielectric layer 212 may be in the form of a multi-layered structure based on the bandgap engineered (BE) theory, so as to achieve the higher injection current and the faster programming speed and better retention. Each bottom dielectric layer 212 consisting of multiple films is, for example, a stacked structure of low K/high K materials or a stacked structure of low K/high K/low K materials. The stacked structure of low K/high K materials can be silicon oxide/HfSiO, silicon oxide/$HfO_2$, or silicon oxide/silicon nitride. The stacked structure of low K/high K/low K materials can be silicon oxide/silicon nitride/silicon oxide, or silicon oxide/$Al_2O_3$/silicon oxide. The top dielectric layers 214 are, for example, disposed between charge storage layers 204 and the conductive layer 202, respectively. Likewise, each top dielectric layer 214 can be a dielectric material in the form of a single-layer structure, and the material thereof is, for example, silicon oxide, HfAlO or $Al_2O_3$. Each top dielectric layer 214 can be in the form of a multi-layered structure based on the BE theory, such as stacked films of silicon nitride/silicon oxide, or silicon oxide/silicon nitride/silicon oxide.

The doped regions 206, as buried diffusion (BD) of the memory device, are configured in the substrate 200 under the bottoms of the trenches 210, respectively. The doped regions 206 are heavily-doped regions, serving as source and drain regions respectively. The dopant dosage in the doped regions 206 may be substantially within a range of $1e20\ cm^{-3}$ to $5e20\ cm^{-3}$, preferably about $e20\ cm^{-3}$. The doped regions 206, for example, are separated from each other. More specifically, as shown in FIG. 2B, the doped regions 206 can further extend from the bottom of each trench 210 to both sidewalls of a lower portion of each trench 210, respectively. Junctions of the recessed doped regions 206 are apart from the surface of the substrate 200, and a length $L_2$ from the junction of each doped region 206 to the substrate 200 along the sloped sidewall is, for example, within a range of 100 angstroms to 200 angstroms. Therefore, physical bits 220a and 220b are configured in the charge storage layers 204 at the junctions of doped regions 206 on the sloped sidewalls of the trenches 210, respectively. It is noted that when the substrate 200 is P-type, dopants implanted into the doped regions 206 can be N-type; when the substrate 200 is N-type, dopants implanted into the doped regions 206 can be P-type. A pocket region (not shown) can be further configured in the substrate 200 adjacent to each of the doped regions 206, respectively. The pocket region can be applied for improving punch immunity between two doped regions 206.

In addition, the memory device in an embodiment of the present invention further includes a gate dielectric layer 218, disposed on the surface of the substrate 200 between two adjacent trenches 210. In other words, the gate dielectric layer 218 covers the surface of the substrate 200 where the charge storage layers 204 are not disposed, for instance. The gate dielectric layer 218 can further extend horizontally in the conductive layer 202 above the trenches 210. In an embodiment, an extension length $L_3$ at each end of the gate dielectric layer 218 may range between 0 angstrom to 50 angstroms. The material of the gate dielectric layer 218 may be a low-K dielectric material, e.g. silicon oxide, or a high-K dielectric material, e.g. HfAlO.

The memory device of the present invention includes a plurality of memory cells 222. Two adjacent memory cells 222, for example, share a common doped region 206, and the memory cells 222 can be connected with each other in X-direction by the conductive layer 202 (i.e. word lines). In each of the memory cells 222, two bits 220a and 220b are mirror-systematically configured in the charge storage layer 204. Take a single memory cell 222 for example, the charge storage layer 204 located on the sidewalls of the trench 210 at the junctions of the doped regions 206, i.e. the bits 220a and 220b, can store two bits of data. Due to separation of each charge storage layer 204, two adjacent bits 220a and 220b for electron storage are well isolated in each memory cell 222. Hence, the second bit effect can be suppressed efficiently and the program disturbance can be avoided.

In addition, the region between the bits 220a and 220b, for example, serves as a planar channel region 224 in the memory cell 222. The planar channel region 224 is covered by the gate dielectric layer 218. In an embodiment, as shown in FIG. 2B, the planar channel region 224 can be a surface channel. As the bits 220a and 220b are configured on the sidewalls of the trenches 210, the bits 220a and 220b are apart from the surface of the substrate 200. The region between the surface of the substrate 200 and the junction nearby bit 220a or between the surface of the substrate 200 and the junction nearby bit 220b may serve as a vertical-channel-like region, and thus, an effective channel region can be lengthened by the extended vertical-channel-like regions. That is to say, the effective channel length in each memory cell 222 can be regarded as addition of a length $L_4$ of the planar channel region 224 and the length $L_2$ along the sloped sidewalls at both sides of the planar channel region 224. By comparing with the conventional stacked memory device, the length $L_4$ of the planar channel region 224 can be further shrunk with the aid of the vertical-channel-like regions, and the storage density is relatively increased with the same array area. In an embodiment, the length $L_4$ may be shrunk to 50 nm for achievement of advanced miniaturization.

Moreover, since the thinner gate dielectric layer 218 is disposed above the planer channel region 224 as compared with the conventional composite dielectric layers, gate controllability over the substrate 200 can be improved and better DC performance can also be obtained. Therefore, performance and drivability of the device are enhanced.

Additionally, because the doped regions 206 are formed in the substrate 200 at the location of the trenches 210, diffusion of the doped regions 206 with a deeper depth can be obtained. The program disturbance is further mitigated and resistance of the doped regions 206 is reduced due to the recessed doped regions 206.

Figure 2C:
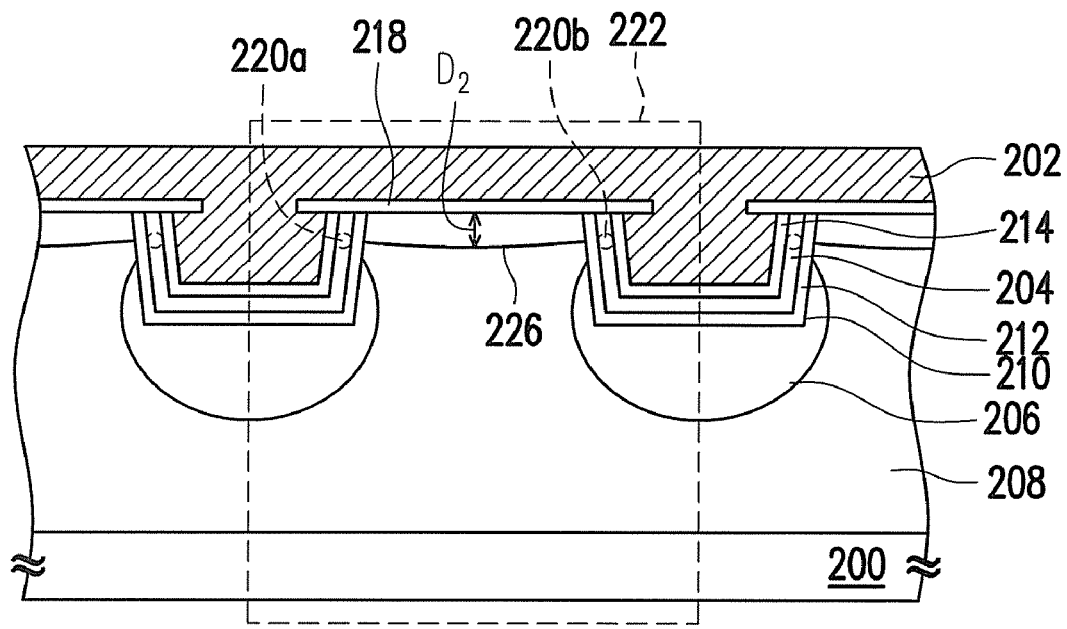
FIG. 2C and FIG. 2D are respectively schematic, cross-sectional diagrams of the memory device shown in FIG. 2A along line A-A' according to another embodiment of the present invention.
Figure 2D:
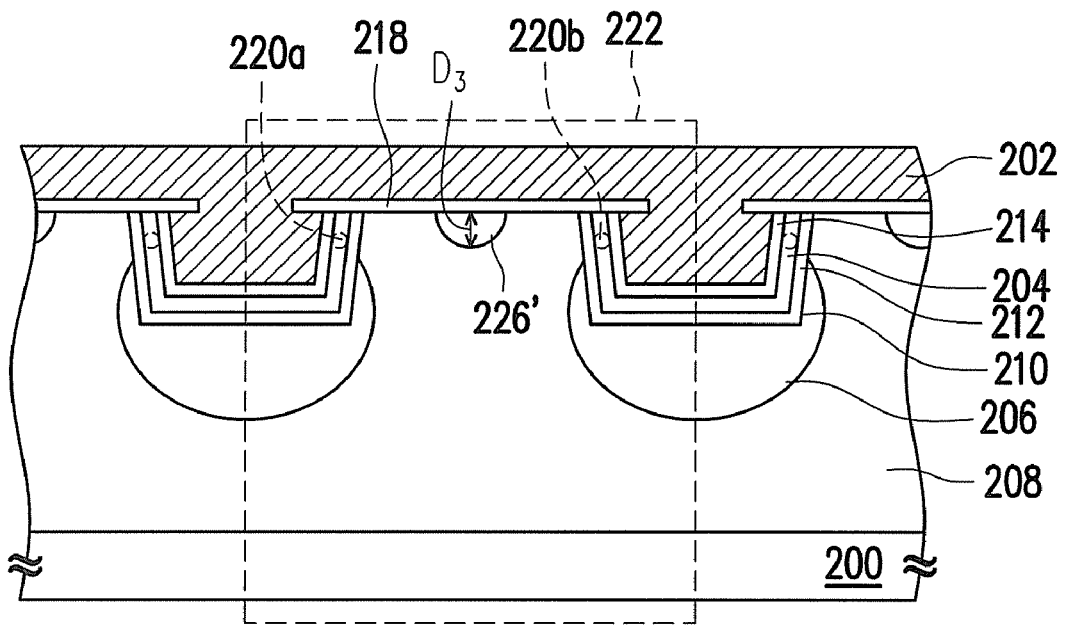

FIG. 2C and FIG. 2D are respectively schematic, cross-sectional diagrams of the memory device shown in FIG. 2A along line A-A' according to another embodiment of the present invention. The identical elements shown in FIGS. 2B, 2C and 2D are designated with the same reference numbers, and detailed descriptions of the same or like elements are omitted hereinafter.

In another embodiment, reduction in initial threshold voltage (Vt) can be achieved by suitable doping engineering in the channel region, while the punch immunity between the doped junctions 206 are well maintained. As shown in FIG. 2C, the planar channel region between the adjacent bits 220a and 220b in each memory cell 222 can be a buried channel 226 configured in the substrate 200 between two adjacent trenches 210. The buried channel 226, i.e. planar channel region, is a lightly doped region with the same conductive type as the doped regions 206, for instance. The dopant dosage doped in the buried channel 226 may be substantially within a range of $3e16$ $cm^{-3}$ to $3e17$ $cm^{-3}$. A vertical depth $D_2$ of the buried channel 226 is substantially within a range of 50 angstroms to 150 angstroms.

Alternatively, the planar channel region in each memory cell 222 may partially include a buried channel 226'. In other words, the buried channel 226' constitutes a portion of the planar channel region in each memory cell 222. It should be noted that the buried channel 226' in the example shown in FIG. 2D is provided for illustration purposes, and is not construed as limiting the scope of the present invention. It is appreciated by persons skilled in the art that the buried channel 226' not only can be disposed in the substantial central portion of the planar channel region, but can also be disposed in any portion of the planar channel region. The buried channel 226' is, for example, a lightly doped region, and the dopant dosage doped therein may be substantially within a range of $3e16$ $cm^{-3}$ to $3e17$ $cm^{-3}$. A vertical depth $D_3$ of the buried channel 226' is substantially within a range of 50 angstroms to 150 angstroms. Thus, owing to the deployment of the buried channel 226 or 226' in the planar channel region, the initial threshold voltage (Vt) can be properly tuned and further reduced.

Figure 3A:
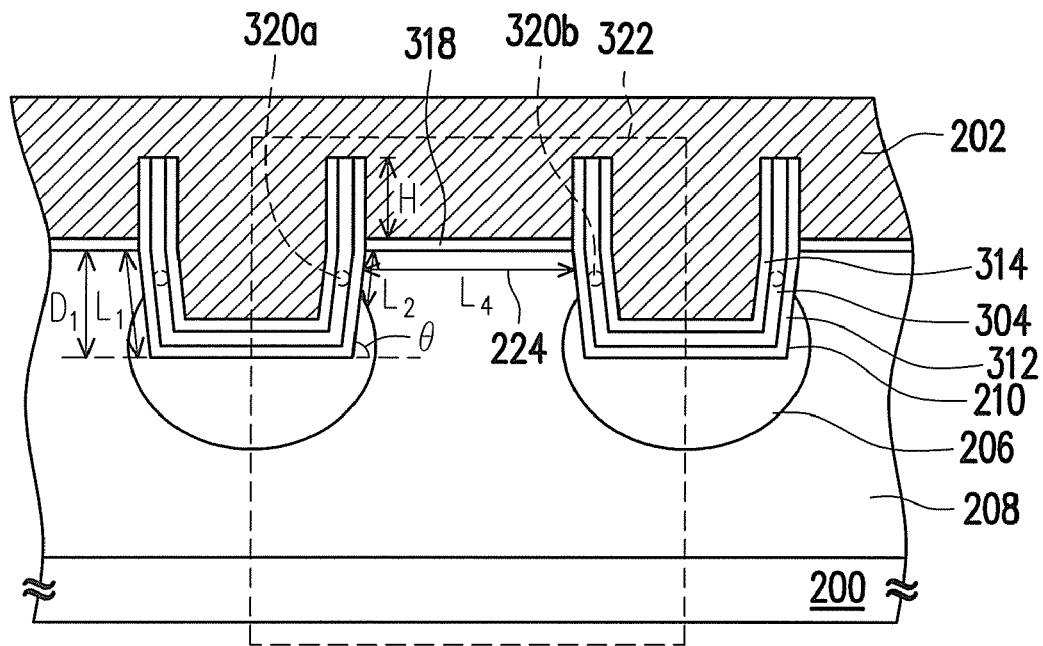
FIG. 3A and FIG. 3B are respectively schematic, cross-sectional diagram of the memory device shown in FIG. 2A along line A-A' according to another embodiment of the present invention.
Figure 3B:
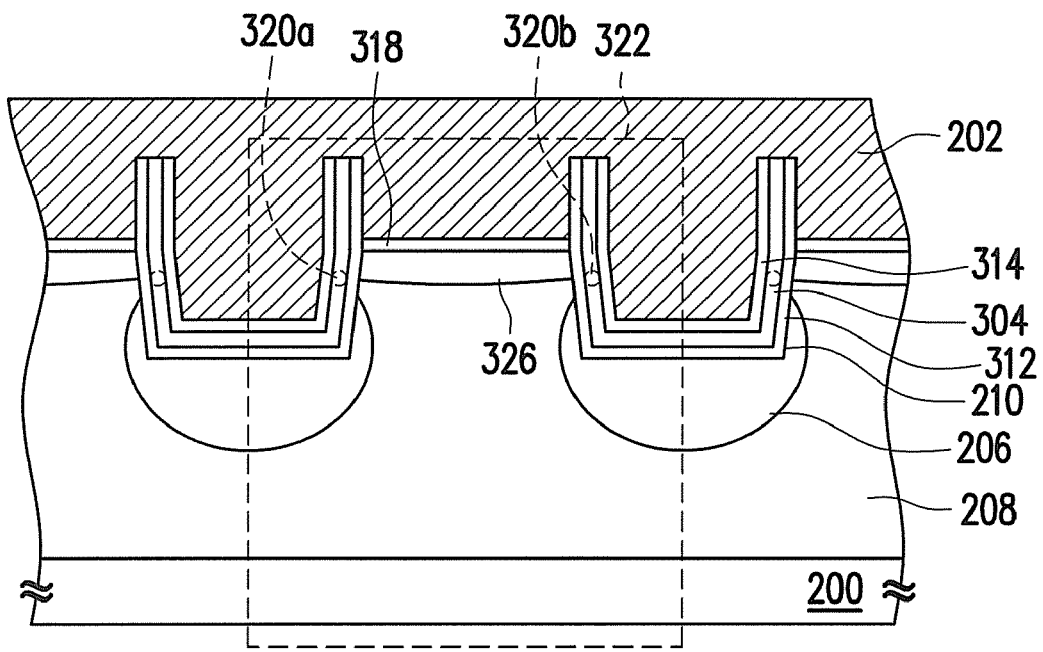

FIG. 3A and FIG. 3B are respectively schematic, cross-sectional diagram of the memory device shown in FIG. 2A along line A-A' according to another embodiment of the present invention. The identical elements shown in FIGS. 3A, 3B and 2A are designated with the same reference numbers, and detailed descriptions of the same or like elements are omitted hereinafter.

In another embodiment, the structure of the memory device shown in FIG. 3A is roughly similar to that shown in FIG. 2A, while the difference lies in the deployment of the charge storage layers. Referring to FIG. 3A, the charge storage layers 304 further extend in the conductive layer 202 above the substrate 200. In details, the charge storage layers 304 not only are disposed conformally on the surfaces of the trenches 210, but also extend upward above the surface of the substrate 200, respectively. Each charge storage layer 304 extends from the surfaces of the substrate 200 with a vertical height H substantially ranging between 300 angstroms and 800 angstroms. It is noted that the charge storage layers 304 are still separated from each other, and the surface of the substrate 200 between two adjacent trenches 210 is covered by the gate dielectric layer 318. Since each charge storage layer 304 is disposed between the bottom dielectric layer 312 and the top dielectric layer 314, the bottom dielectric layer 312 and the top dielectric layer 314 are, for example, conformally extend in the conductive layer 202 above the substrate 200.

As shown in FIG. 3A, in each of the memory cells 322, the physical bits 320a and 320b are mirror-systematically configured in the charge storage layer 304 neighboring to the junctions of doped regions 206 on the sidewalls of the trenches 210, respectively. The planar channel region 224 between the adjacent bits 320a and 320b in each memory cell 322 can be a surface channel. Since the charge storage layers 304 are separated from each other, two adjacent bits 320a and 320b for electron storage are well isolated in each memory cell 322.

Alternatively, referring to FIG. 3B, the planar channel region between the adjacent bits 320a and 320b in each memory cell 322 can be a buried channel 326 configured in the substrate 200 between two adjacent trenches 210. The buried channel 326 is, for example, a lightly doped region. Likewise, the planar channel region in each memory cell 322 is not particularly limited to the entire buried channel 326. The buried channel can also be configured in a portion of the planar channel region, as illustrated in FIG. 2D. People skilled in the art should be able to make modifications in accordance with said embodiments, and thus, the detailed descriptions thereof are not described herein.

The following description is provided to illustrate methods for operating the memory device in an embodiment of the present invention. These examples are provided to illustrate effects upon the programming operation made by applying various bias to the doped regions and to the conductive layer (word line), but is not intended to limit the scope of the present invention.

In the programming operation, a positive voltage $V_g$ is applied to the word line (i.e. conductive layer) that is connected to the selected memory cell. The voltage $V_g$ is about 5.5 V to 7.5 V, for example. A positive voltage $V_d$ is applied to a doped region that is adjacent to the first bit to be programmed subsequently. The voltage $V_d$ is about 3.5 V to 5.5 V, for example. A voltage $V_s$ is applied to another doped region that is adjacent to the second bit not to be programmed. The voltage $V_s$ is about 0 V, for example. A voltage $V_{sub}$ is applied to the substrate, that is, to the well region. The voltage $V_{sub}$ is about 0 V, for example. In this operation, the voltage $V_g$ is higher than the voltage $V_{sub}$, and the voltage $V_d$ is higher than the voltage $V_s$. Under the aforesaid bias applied to the respective doped regions and to the word line, hot carriers are sufficiently induced and injected into the charge storage layer near the selected doped region adjacent to the first bit and further trapped therein. Accordingly, the first bit of the memory cell is programmed by the channel hot electron injection (CHEI).

It is noted that the physical bits are configured on the sidewalls of the trenches and the conductive layer serving as the gate fills the trenches in an embodiment of the present invention. When the bias is applied as mentioned above, the voltage difference between the gate in the trenches and the substrate is provided laterally on the sidewalls of the trenches. Hence, the hot carrier can be therefore accelerated to directly inject into the first bit through the channel region without redirection.

Figure 4A:
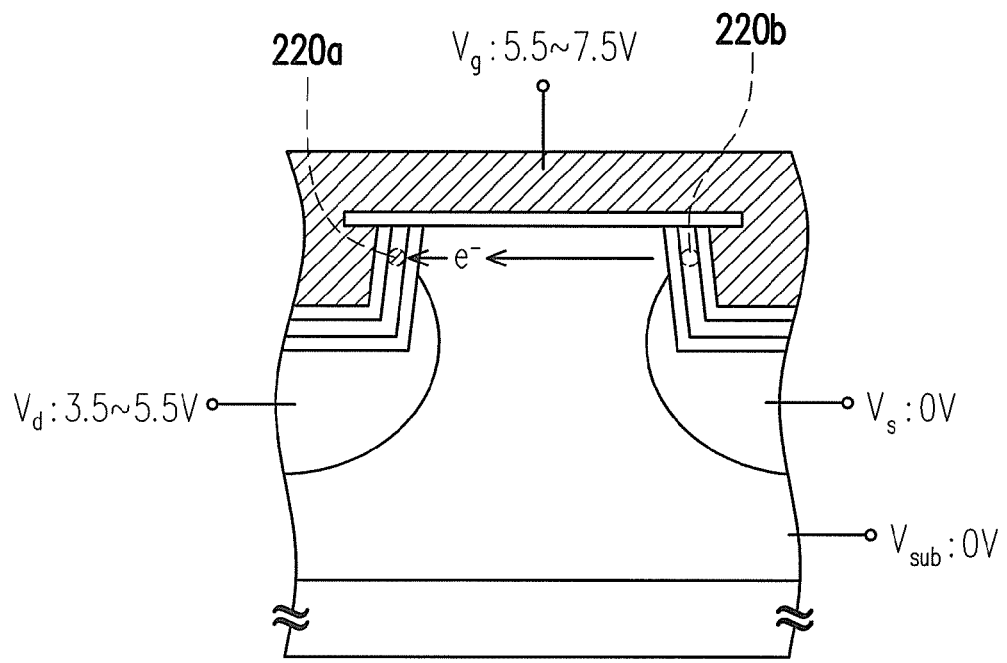
FIGS. 4A-4B schematically depict, in a cross-sectional diagram, a programming operation of the memory device according to an embodiment of the present invention respectively.
Figure 4B:
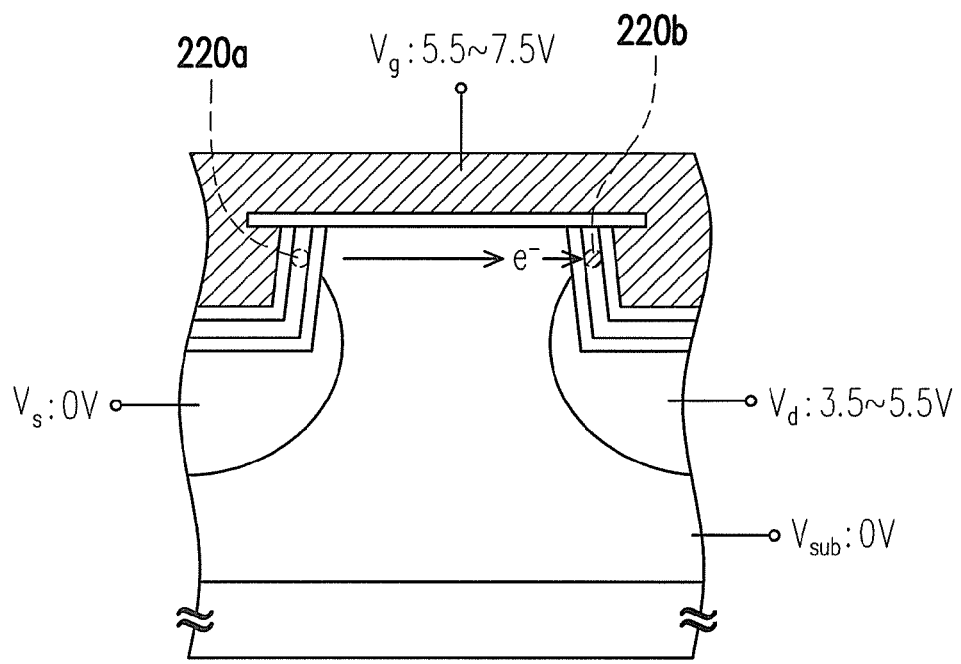

FIGS. 4A-4B schematically depict, in a cross-sectional diagram, a programming operation of the memory device according to an embodiment of the present invention respectively. A single memory cell 222 shown in FIG. 2B is introduced into the following as a simplified exemplary example.

As shown in FIG. 4A, the following description in which the bit 220a of the memory cell is being programmed is taken as an example for illustration purposes, that is, electrons can be stored in the bit 220a. In the programming operation, the voltage $V_g$ is applied to the word line. The voltage $V_d$ is applied to the doped region adjacent to the bit 220a. The voltage $V_s$ is applied to the doped region adjacent to the bit 220b. The voltage $V_{sub}$ is applied to the well region. When the positive bias is applied onto the word line and the doped region adjacent to the bit 220a, a lateral electrical field is created along the planar channel region to accelerate the electrons from the doped region adjacent to the bit 220b toward the bit 220a. As the electrons move along the planar channel, some of the electrons gain sufficient energy to jump over the potential barrier of the bottom dielectric layer, and are then trapped in the charge storage layer at the bit 220a. Therefore, the bit 220a can be programmed owing to the aforesaid bias deployment.

As shown in FIG. 4B, the following description in which the bit 220b of the memory cell is taken as an example for illustration purposes, that is, electrons can be stored in the bit 220b. In the programming operation, the voltage $V_g$ is applied to the word line. The voltage $V_d$ is applied to the doped region adjacent to the bit 220b. The voltage $V_s$ is applied to the doped region doped region adjacent to the bit 220a. The voltage $V_{sub}$ is still applied to the well region. As described above, the electrons accelerated through the planar channel region are directly injected into the charge storage layer on the sidewall of the trench, and are then trapped therein. Thus, the bit 220b can be programmed without redirecting the electrons and losing energy for redirection.

Figure 5A:
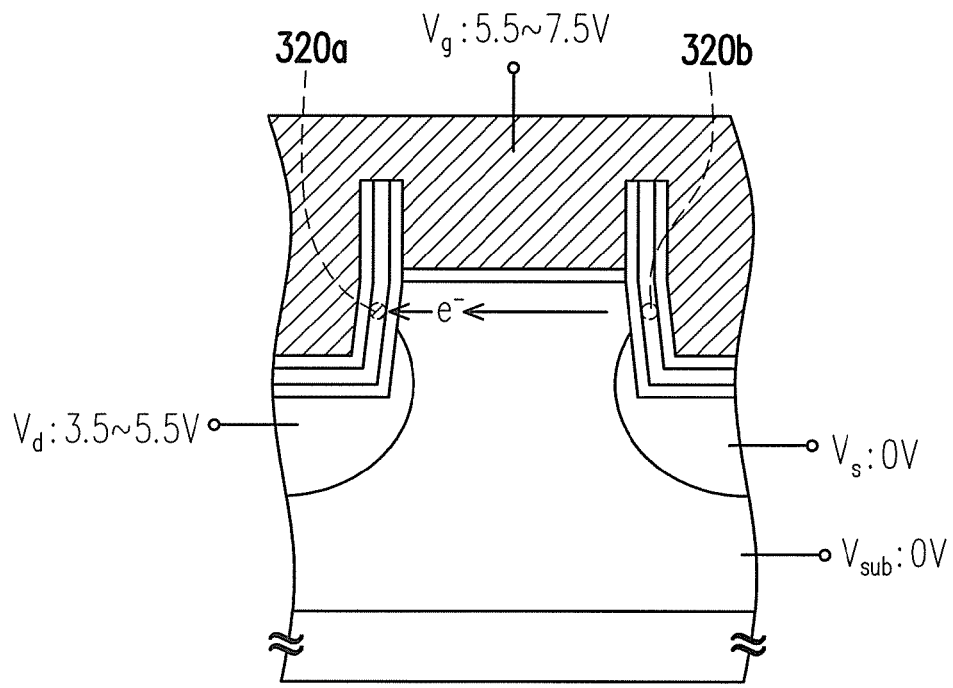
FIGS. 5A-5B schematically depict, in a cross-sectional diagram, a programming operation of the memory device according to another embodiment of the present invention respectively.
Figure 5B:
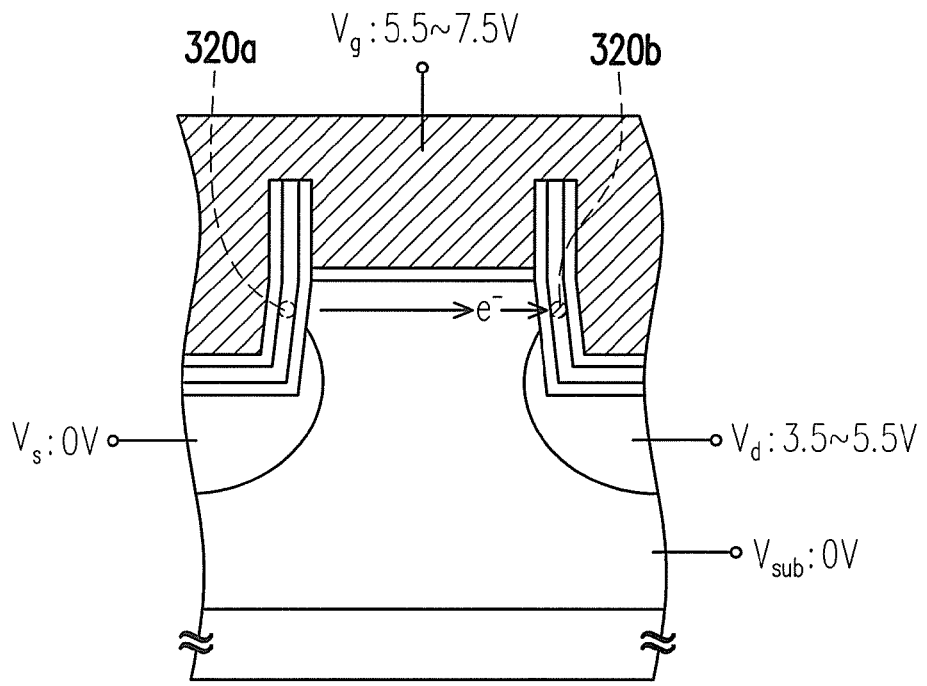

FIGS. 5A-5B schematically depict, in a cross-sectional diagram, a programming operation of the memory device according to another embodiment of the present invention respectively. A single memory cell 322 shown in FIG. 3A is introduced into the following as a simplified exemplary example.

Similarly, as shown in FIG. 5A, the following description in which the bit 320a of the memory cell is being programmed is taken as an example for illustration purposes. In the programming operation, the voltage $V_g$ is applied to the word line. The voltage $V_d$ is applied to the doped region adjacent to the bit 320a. The voltage $V_s$ is applied to the doped region adjacent to the bit 320b. The voltage $V_{sub}$ is applied to the well region. When the positive bias is applied onto the word line and the doped region adjacent to the bit 320a, a lateral electrical field is created along the planar channel region to accelerate the electrons from the doped region adjacent to the bit 320b toward the bit 320a. As the electrons move along the planar channel, some of the electrons gain sufficient energy to jump over the potential barrier of the bottom dielectric layer, and are then directly injected into the charge storage layer on the sidewall of the trench without redirection. Therefore, the bit 220a can be programmed with higher injection efficiency due to the direct injection of carriers.

As shown in FIG. 5B, the following description in which the bit 320b of the memory cell is taken as an example for illustration purposes. In the programming operation, the voltage $V_g$ is applied to the word line. The voltage $V_d$ is applied to the doped region adjacent to the bit 320b. The voltage $V_s$ is applied to the doped region doped region adjacent to the bit 320a. The voltage $V_{sub}$ is still applied to the well region. As described above, the electrons accelerated through the planar channel region are directly injected into the charge storage layer on the sidewall of the trench, and are then trapped therein. Thus, the bit 320b can be efficiently programmed without redirecting the electrons and losing energy for redirection.

In the operating method of the memory device in an embodiment of the present invention, the single bit can be programmed by means of the channel hot electron injection (CHEI). Since the lateral electrical field and carrier injection are in the same direction, carriers accelerated by channel potential are directly injected into the charge storage layer on the sidewall without redirecting the electrons above the planar channel region. The energy loss attributed to the redirection collision in the progress of the conventional channel hot electron injection no longer exists, so that higher injection current and superior programming efficiency can be accomplished. In addition, magnitude of the voltage $V_g$ applied to the gate can be decreased therefor.

The methods for fabricating the foregoing memory device according to several embodiments of this invention are then described with cross-sectional diagrams as follows. The following fabricating methods merely demonstrate the procedures for constructing the structure of the memory device respectively shown in FIG. 2B and FIG. 3A in detail, which enable one of ordinary skill in the art to practice the present invention but are not intended to limit the scope of this invention.

FIGS. 6A-6E depict, in a cross-sectional view, a method for fabricating the memory device according to an embodiment of the present invention.

Figure 6A:
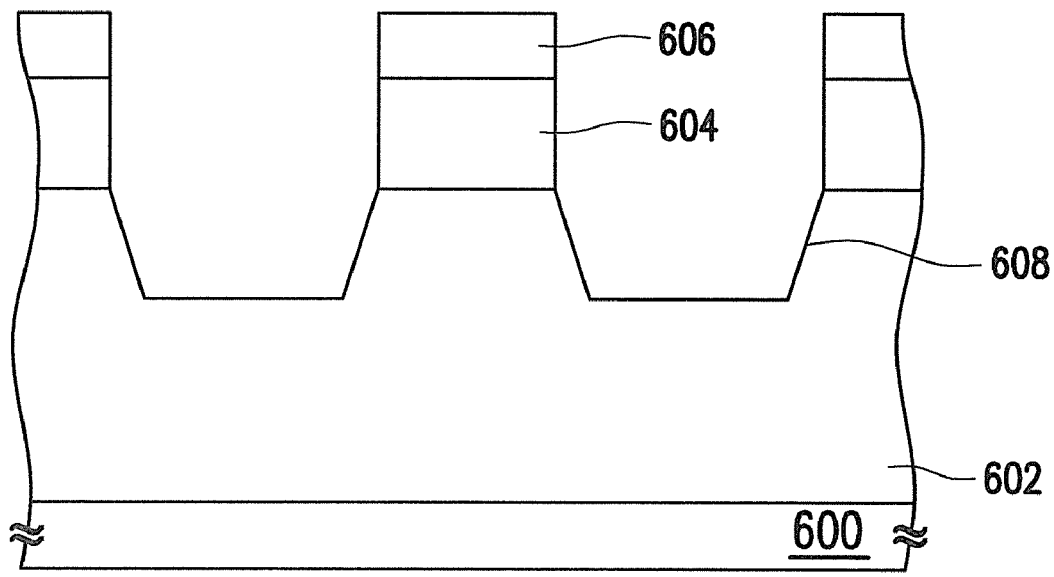
FIGS. 6A-6E depict, in a cross-sectional view, a method for fabricating the memory device according to an embodiment of the present invention.

Referring to FIG. 6A, a substrate 600 is provided, which may be a P-type or an N-type silicon substrate, a P-type or an N-type epi-silicon substrate or a P-type or an N-type semiconductor-on-insulator (SOI) substrate. A P-well or an N-well region 602 may be formed in the P-type or N-type substrate 600, respectively. In an embodiment, a buried channel (not shown), e.g. a lightly doped region with the same conductive type as the source/drain regions, can be optionally formed in the substrate 600. The dopant dosage doped in the buried channel may be substantially within a range of 3e16 $cm^{-3}$ to 3e17 $cm^{-3}$. A vertical depth of the buried channel from the surface of the substrate 600 is substantially within a range of 50 angstroms to 150 angstroms. Afterwards, a pattern layer 604 and a patterned hard mask layer 606 are formed in sequence on the substrate 600. The pattern layer 604 is, for example, formed by using the patterned hard mask layer 606 as a mask for defining trenches to be subsequently formed. The material of the pattern layer 604 may be silicon oxide or other materials with etching selectivity different from the substrate 600.

Afterwards, a portion of the substrate 600 is removed to form trenches 608. The removal of the substrate 600 may be carried out by a sloped silicon etching process using the pattern layer 604 and the patterned hard mask layer 606 as a mask. Therefore, the resultant trenches 608 may have sloped sidewalls. An extending direction of a bottom of each trench 608 and the sloped sidewall thereof form an included angle within a range of 45° to 75°, and a length of the sloped sidewall is substantially within a range of 350 angstroms to 500 angstroms. A vertical depth of each trench 608 is substantially within a range of 250 angstroms to 350 angstroms. In an embodiment, the sloped silicon etching process can be carried out by wet etching with suitable recipes containing various acids. In another embodiment, the sloped silicon etching process can be carried out by plasma etching with suitable combinations of various gases, such as $CHF_3$, $CF_4$, Ar and $O_2$.

Figure 6B:
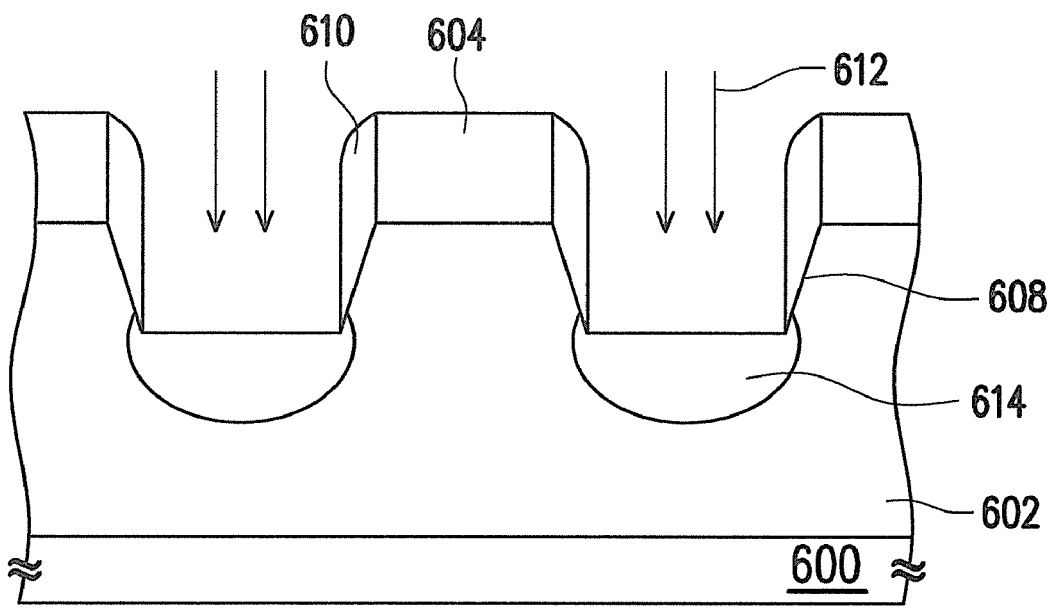

Referring to FIG. 6B, the patterned hard mask layer 606 is removed. A spacer material layer (not shown) is then formed on the substrate 600 and covers the pattern layer 604. A portion of the spacer material layer is then removed by an anisotropic etching process to form a pair of spacers 610 on the sidewalls of the pattern layer 604 over the substrate 600. The spacers 610 cover the sloped sidewalls of the trenches 608 for defining the subsequently-formed source and drain regions.

An implantation process 612 is then conducted for implanting dopants into the substrate 600 to form doped regions 614 therein using the pattern layer 604 and the spacers 610 as a mask. The doped regions 614 are formed under the bottoms of the trenches 608 at respective outer sides of the spacers 610, and serve as a source region and a drain region. The doped regions 614 further extend from the bottoms of the trenches 608 to the lower portion of the trenches 608. The doped regions 614 may be N-type heavily-doped regions formed in the P-type substrate 600, while the doped regions 614 may be P-type heavily-doped regions formed in the N-type substrate 600. In an embodiment, when the N-type doped regions 614 is formed, the implantation process 612 may be conducted vertically by a single implant under the energy of 10~25 KeV with the dosage of 1e15~3e15 $cm^{-2}$ or, in the alternative, by double implants consisting of an implant under the energy of 5~15 KeV with the dosage of 1e15~3e15 $cm^{-2}$ and the other one under the energy of 35~70 KeV with the dosage of 5e13~1e15 $cm^{-2}$. Moreover, pocket regions (not shown) can be optionally formed in the substrate 600 under the pattern layer 604 and adjacent to each doped region 614, respectively. The pocket regions can be applied for better punch immunity between the doped regions 614. The pocket regions are formed, for example, by implanting dopants with a tilted angle.

Figure 6C:
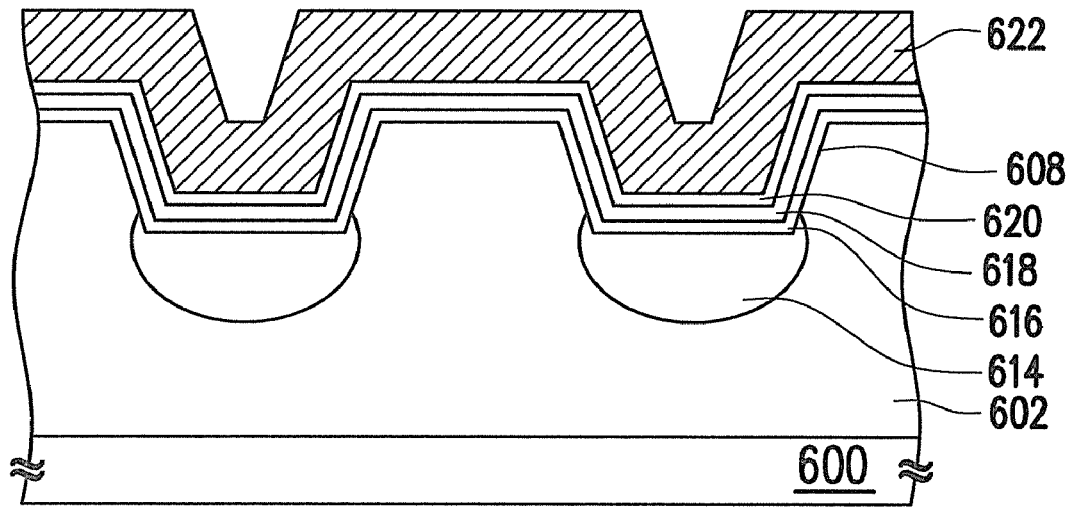

Referring to FIG. 6C, the pattern layer 604 and the spacers 610 are removed. Afterwards, a bottom dielectric material layer 616, a charge storage material layer 618 and a top dielectric material layer 620 are conformally foamed on the substrate 600 in sequence. The surfaces of the trenches 608 are, for example, lined with the bottom dielectric material layer 616, the charge storage material layer 618 and the top dielectric material layer 620. A conductive material layer 622 is then formed on the substrate 600. The conductive material layer 622 may cover the top dielectric material layer 620 and fill the trench 608. The material of the bottom dielectric material layer 616 is, for example, a low-K material or a high-K material. The bottom dielectric material layer 616 can be formed in the form of a single-layer structure or in the form of a multi-layered structure based on the bandgap engineered (BE) theory. In an embodiment, the single film of the bottom dielectric material layer 616 may be silicon oxide or HfAlO. In an embodiment, the bottom dielectric material layer 616 can be a stacked structure of low K/high K materials or a stacked structure of low K/high Mow K materials, such as silicon oxide/HfSiO, silicon oxide/$HfO_2$, silicon oxide/silicon nitride, silicon oxide/silicon nitride/silicon oxide, or silicon oxide/$Al_2O_3$/silicon oxide. The material of the charge storage material layer 618 includes charge-trapping materials, e.g. silicon nitride or silicon-rich nitride. The material of the top dielectric material layer 620 is, for example, a low-K material or a high-K material. The top dielectric material layer 620 could be formed in the form of a single-layer structure or in the form of a multi-layered structure based on the bandgap engineered (BE) theory. In an embodiment, the material of the single-layered top dielectric material layer 620 may be silicon oxide, HfAlO or $Al_2O_3$. In an embodiment, the top dielectric material layer 620 can includes stacked films of silicon nitride/silicon oxide, or silicon oxide/silicon nitride/ silicon oxide. The material of the conductive material layer 622 is, for example, doped polysilicon, metal, or a combination of polysilicon and metal.

Figure 6D:
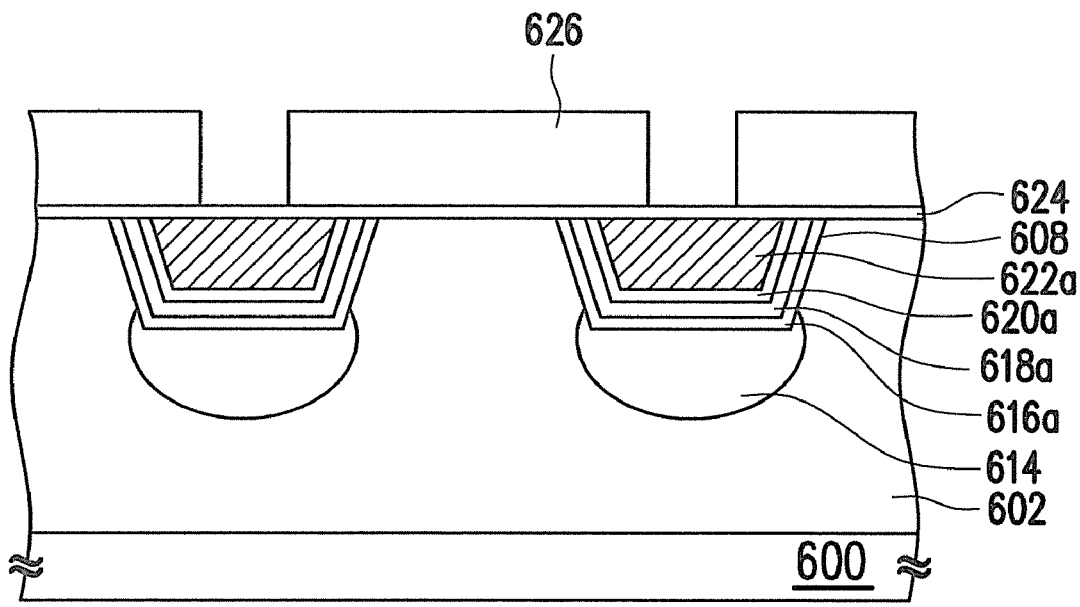

Referring to FIG. 6D, a portion of the conductive material layer 622, the top dielectric material layer 620, the charge storage material layer 618 and the bottom dielectric material layer 616 disposed between two adjacent trenches 608 are removed by performing a chemical-mechanical polishing (CMP) process. A conductive layer 622a, top dielectric layer 620a, charge storage layer 618a and bottom dielectric layer 616a remaining in one trench 608 are separated from those remaining in another trench 608. That is to say, the charge storage layers 618a are only disposed on the surfaces of the trenches 608 respectively. The surface of the substrate 600 between two adjacent trenches 608 is thus exposed.

A gate dielectric material layer 624 and a patterned mask layer 626 are then formed on the substrate 600 in sequence. The gate dielectric material layer 624, for example, covers the exposed surface of the substrate 600 and the conductive layer 622a. The patterned mask layer 626 may cover at least a portion of the gate dielectric material layer 624 disposed between two adjacent trenches 608. In other words, a portion of the gate dielectric material layer 624 corresponding to the exposed surface of the substrate 600 is covered. The gate dielectric material layer 218 may be made of a low-K dielectric material, e.g. silicon oxide, or a high-K dielectric material, e.g. HfAlO. The patterned mask layer 626 can be a patterned photoresist layer or a hard mask.

Figure 6E:
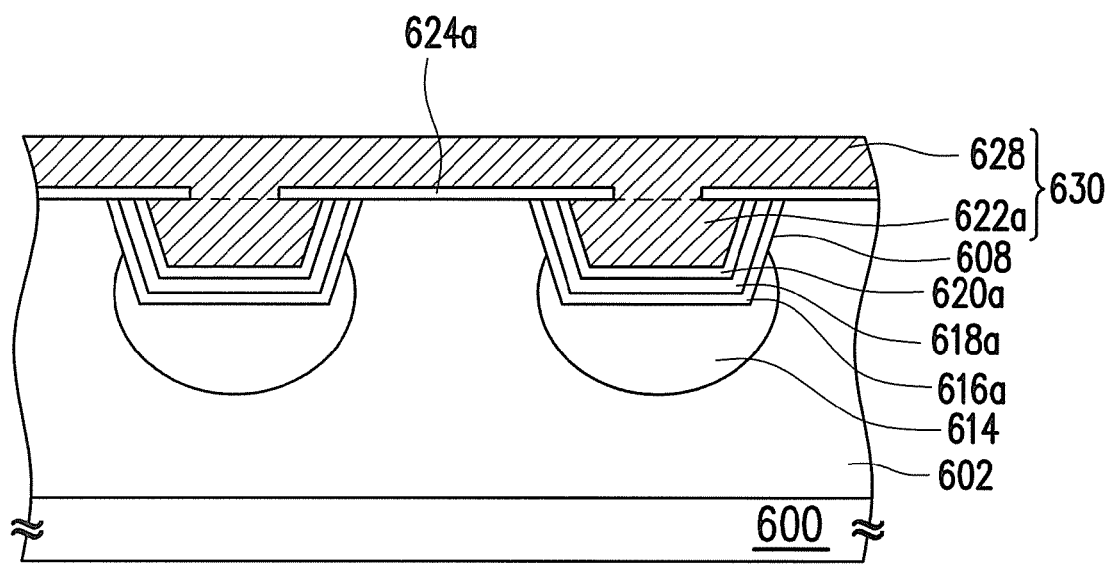

Referring to FIG. 6E, the gate dielectric material layer 624 is patterned by performing an etching process using the patterned mask layer 626 as a mask. A resultant gate dielectric layer 624a is formed at least on the surface of the substrate 600 between two adjacent trenches 608. The gate dielectric layer 624a may further extend on the conductive layer 622a above the trenches 608. Thereafter, a conductive layer 628 is deposited on the substrate 600. The conductive layer 628 covers, for example, the gate dielectric layer 624a and the conductive layer 622a disposed in the trenches 608. The material of the conductive layer 628 can be the same as the conductive layer 622a, e.g. doped polysilicon, metal, or a combination of polysilicon and metal. The conductive layers 628 and 622a are then patterned to form word lines 630, such that the memory device in an embodiment of the present invention is substantially accomplished. In an embodiment, an annealing process may be further conducted to activate the dopants.

FIGS. 7A-7F depict, in a cross-sectional view, a method for fabricating the memory device according to another embodiment of the present invention.

Figure 7A:
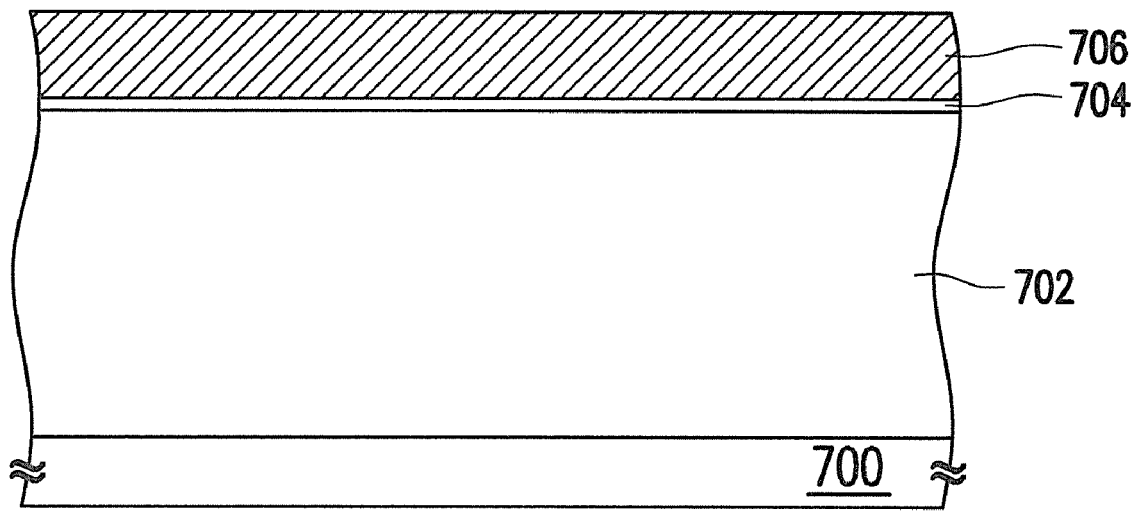
FIGS. 7A-7F depict, in a cross-sectional view, a method for fabricating the memory device according to another embodiment of the present invention.

Referring to FIG. 7A, a substrate 700 is provided, in which a well region 702 may be formed. A gate dielectric material layer 704 and a conductive material layer 706 in sequence are formed on the substrate 700.

Figure 7B:
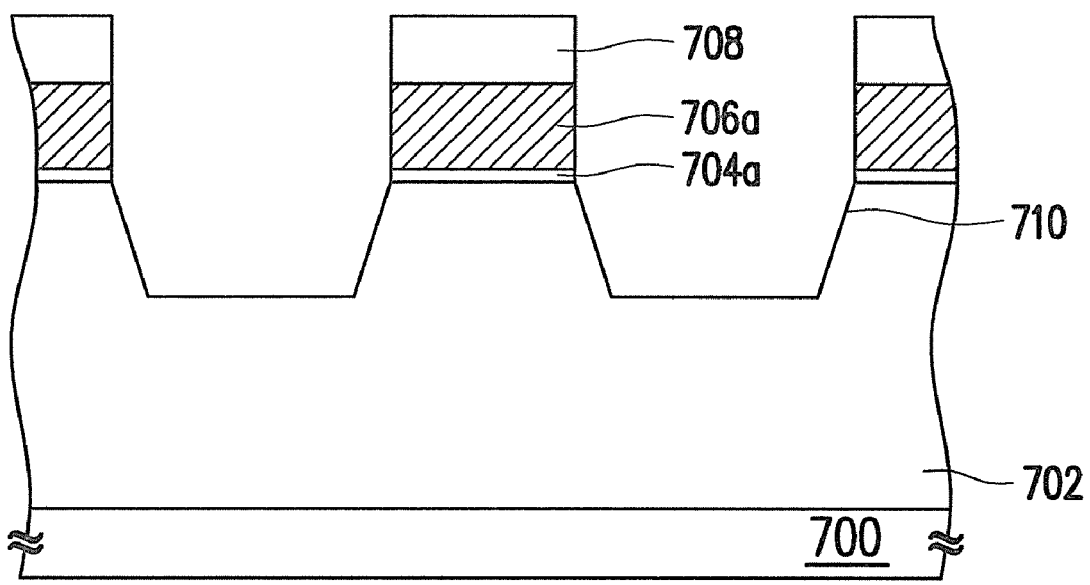

Referring to FIG. 7B, a patterned hard mask layer 708 is formed on the conductive material layer 706. A portion of the conductive material layer 706 and the gate dielectric material layer 704 are removed using the patterned hard mask layer 708 as a mask. A conductive layer 706a and a gate dielectric layer 704a are formed, and the conductive layer 706a serve as a pattern layer for further defining trenches to be formed. Thereafter, a portion of the substrate 700 is removed to form trenches 710 by a sloped silicon etching process using the patterned hard mask layer 708 and the conductive layer 706a as a mask. The resultant trenches 710 may have sloped sidewalls. An extending direction of a bottom of each trench 710 and the sloped sidewall thereof form an included angle within a range of 45° to 75°, and a length of the sloped sidewall is substantially within a range of 350 angstroms to 500 angstroms. A vertical depth of each trench 710 is substantially within a range of 250 angstroms to 350 angstroms.

Figure 7C:
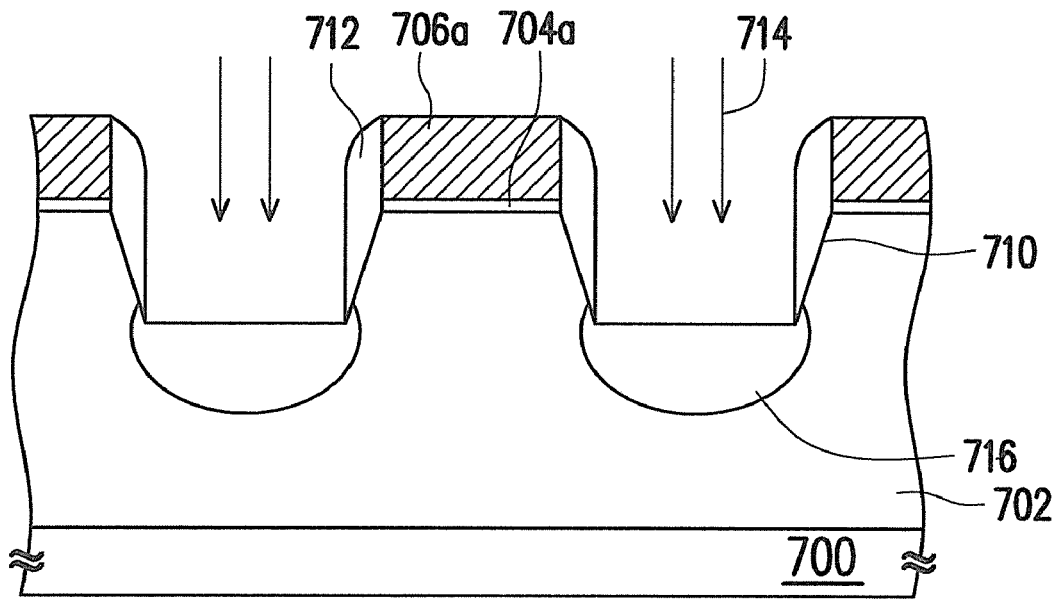

Referring to FIG. 7C, the patterned hard mask layer 708 is removed. A pair of spacers 712 is formed on the sidewalls of the conductive layer 706a, and covers the sloped sidewalls of the trenches 710. An implantation process 714 is then conducted for implanting dopants into the substrate 700 to form doped regions 716 therein by using the conductive layer 706a and the spacers 712 as a mask. The doped regions 716 can be formed in the substrate 700 with the exposed surface, that is, under the bottoms of the trenches 710 at respective outer sides of the spacers 712. The doped regions 716 may further extend from the bottoms of the trenches 710 to the lower portion of the trenches 710. The doped regions 716 are, for example, heavily-doped regions. In an embodiment, the implantation process 714 can be a single vertical implantation conducted under the energy of 10~25 KeV with the dosage of 1e15~3e15 $cm^{-2}$ or, in the alternative, can be double implants consisting of an implant under the energy of 5~15 KeV with the dosage of 1e15~3e15 $cm^{-2}$ and the other one under the energy of 35~70 KeV with the dosage of 5e13~1e15 $cm^{-2}$.

Figure 7D:
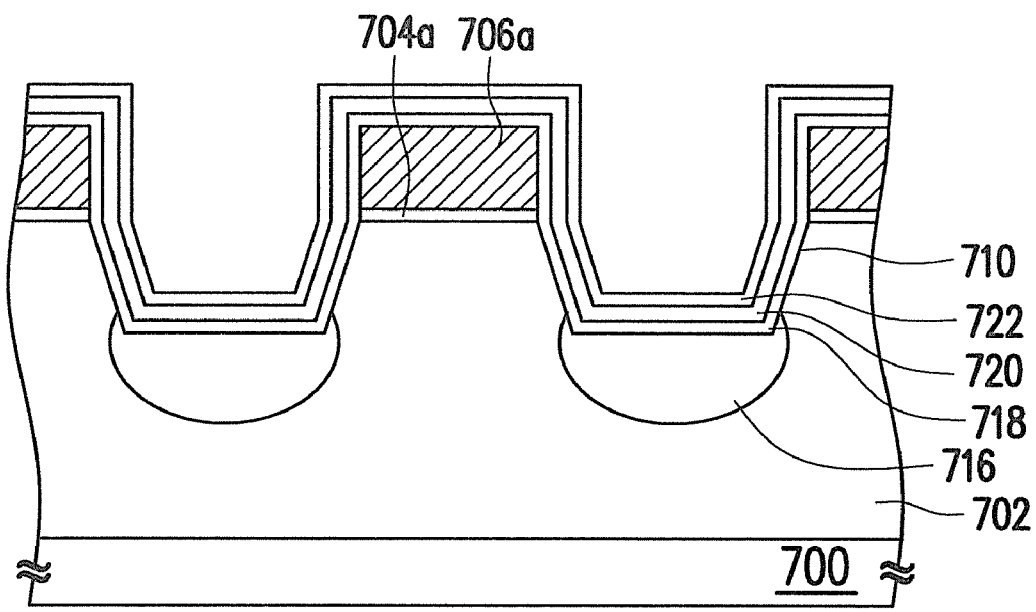

Referring to FIG. 7D, the spacers 610 are removed. A bottom dielectric material layer 718, a charge storage material layer 720 and a top dielectric material layer 722 are conformally formed on the substrate 700 in sequence. The surfaces of the conductive layer 706a and the trenches 710 are, for example, lined with the bottom dielectric material layer 718, the charge storage material layer 720 and the top dielectric material layer 722. A conductive layer 724 is then formed on the substrate 700 and at least fills the trenches 710. The material of the conductive layer 724 can be the same as the conductive layer 706a, e.g. doped polysilicon, metal, or a combination of polysilicon and metal.

Figure 7E:
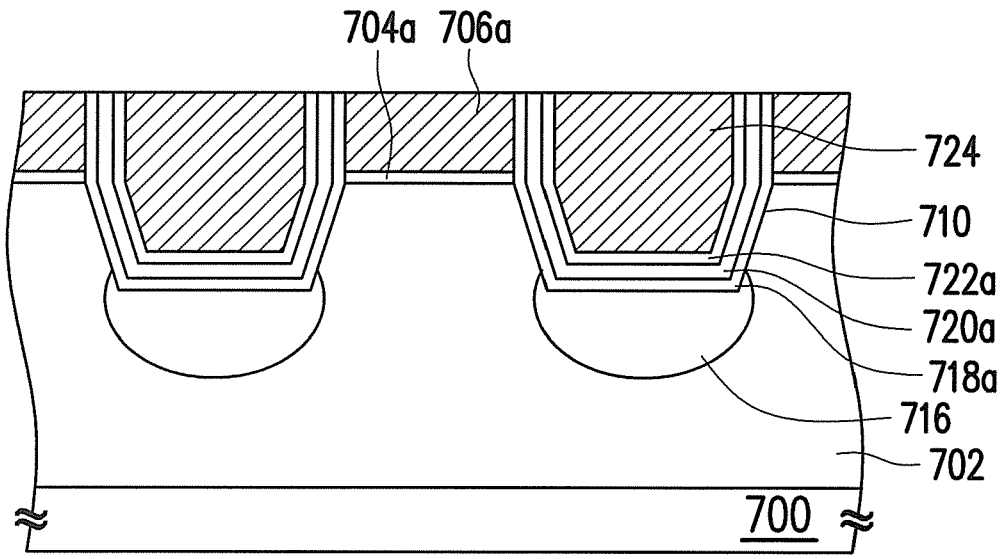

Referring to FIG. 7E, a planarization process, e.g. CMP process, is conducted to remove a portion of the top dielectric material layer 722, the charge storage material layer 720 and the bottom dielectric material layer 718 until the top surface of the conductive layer 706a is exposed. Complex dielectric layers each separated from one another and including a resultant top dielectric layer 722a, a charge storage layer 720a and a bottom dielectric layer 718a are disposed on respective sidewalls of the conductive layer 706a.

Figure 7F:
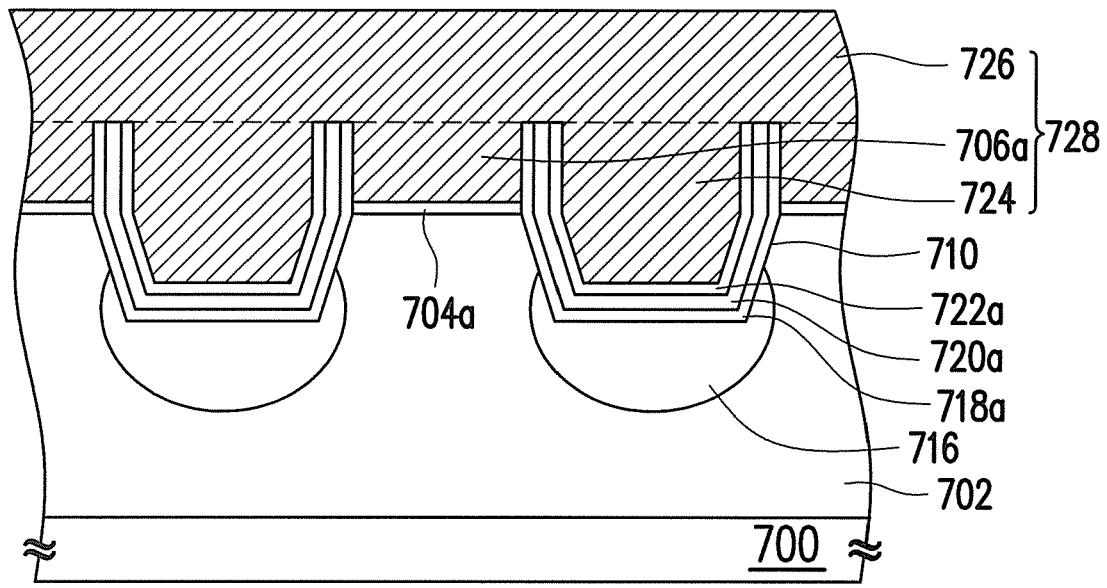

Referring to FIG. 7F, a conductive layer 726 is deposited on the substrate 700. The conductive layer 726 covers, for example, the conductive layer 706a and the conductive layer 724 disposed in the trenches 710. The material of the conductive layer 726 can be the same as the conductive layers 706a and 724. Thereafter, conductive layers 726, 724 and 706a are jointly patterned to form word lines 728, so as to complete the structure of the memory device in an embodiment of the present invention.

Figure 8A:
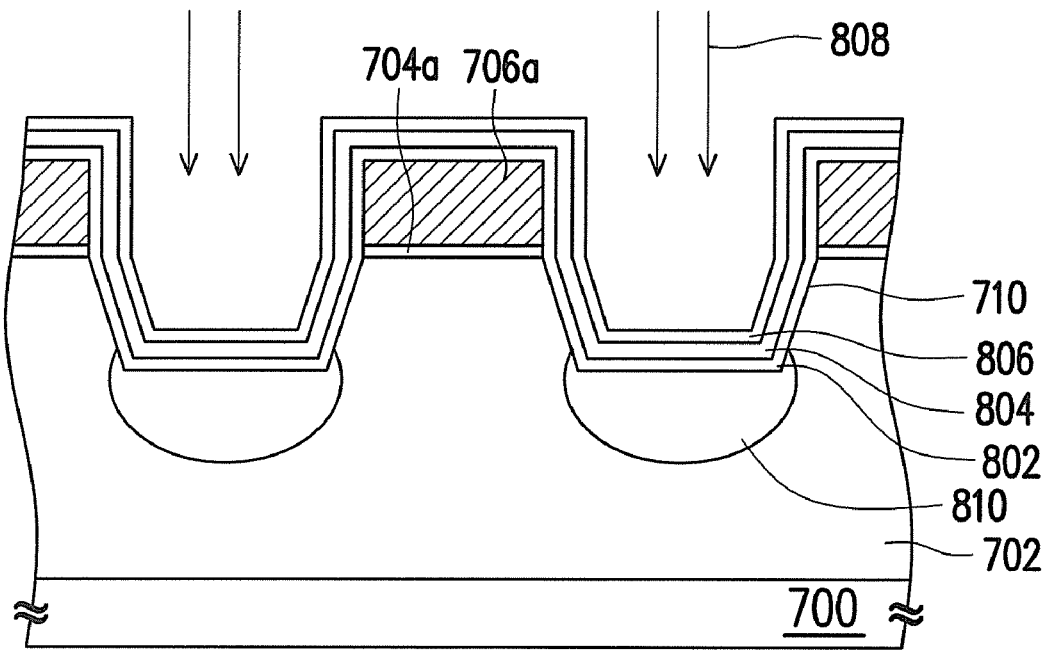
FIGS. 8A-8C depict, in a cross-sectional view, a method for fabricating the memory device according to still another embodiment of the present invention.
Figure 8B:
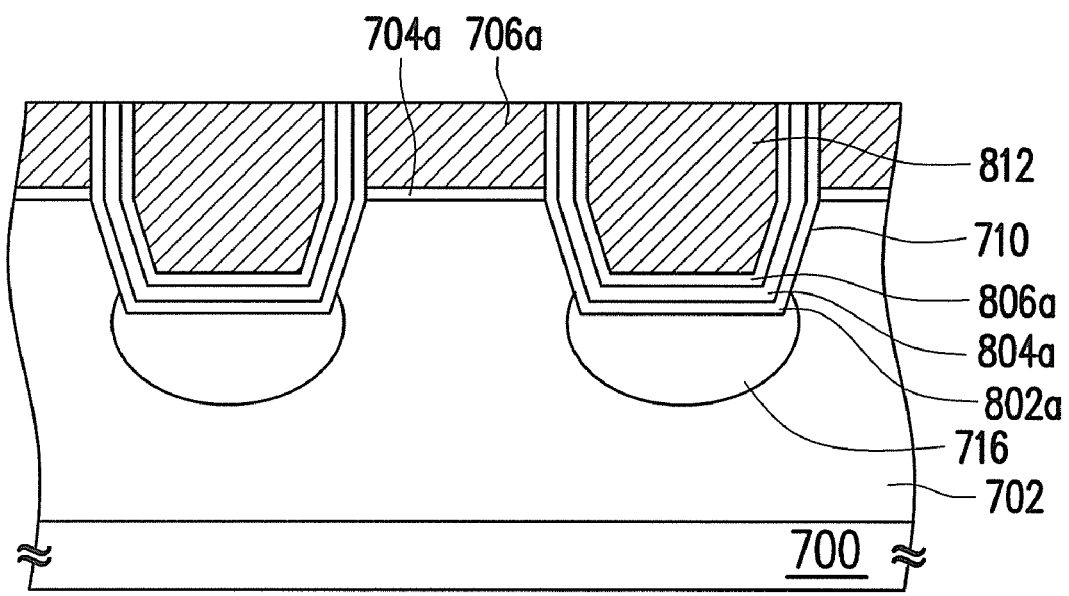
Figure 8C:
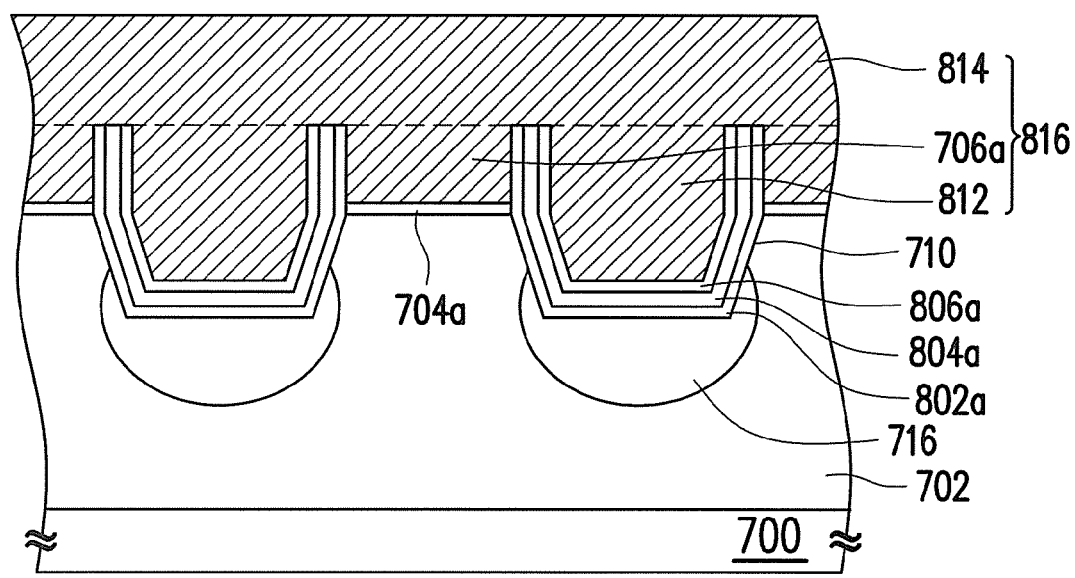

FIGS. 8A-8C depict, in a cross-sectional view, a method for fabricating the memory device according to still another embodiment of the present invention. It is noted that the manufacturing steps depicted in FIGS. 8A-8C follow FIG. 7B with modification. The identical elements shown in FIG. 7B and in FIGS. 8A-8C are designated with the same reference numbers, and the detailed descriptions of the same or like elements are omitted hereinafter.

The process shown in FIGS. 8A-8C is roughly similar to that described in FIGS. 7A-7F, while the difference lies in the sequence of forming the doped regions and forming complex dielectric layer including the charge storage layer. Referring to FIG. 8A, the patterned hard mask layer 708 is removed. A bottom dielectric material layer 802, a charge storage material layer 804 and a top dielectric material layer 806 are conformally formed on the substrate 700 in sequence. The surfaces of the conductive layer 706a and the trenches 710 are, for example, lined with the bottom dielectric material layer 802, the charge storage material layer 804 and the top dielectric material layer 806. Afterwards, an implantation process 808 is then conducted for implanting dopants into the substrate 700 through the bottom dielectric material layer 802, the charge storage material layer 804 and the top dielectric material layer 806, so as to form doped regions 810 in the substrate 700 under the bottoms of the trenches 710. The doped regions 810 may further extend from the bottoms of the trenches 710 to the lower portion of the trenches 710. In an embodiment, the doped regions 810, e.g. heavily-doped regions, can be formed by a single vertical implantation conducted under the energy of 15~30 KeV with the dosage of 1e15~3e15 cm$^{-2}$ or, in the alternative, can be double implants consisting of an implant under the energy of 10~25 KeV with the dosage of 1e15~3e15 cm$^{-2}$ and the other one under the energy of 35~70 KeV with the dosage of 5e13~1e15 cm$^{-2}$.

Referring to FIG. 8B, a conductive layer 812 is then formed on the substrate 700 and at least fills the trenches 710. The material of the conductive layer 812 can be the same as the conductive layer 706a. A planarization process, e.g. CMP process, is then conducted to remove a portion of the top dielectric material layer 806, the charge storage material layer 804 and the bottom dielectric material layer 802 until the top surface of the conductive layer 706a is exposed. Complex dielectric layers each separated from one another and including a resultant top dielectric layer 806a, a charge storage layer 804a and a bottom dielectric layer 802a are disposed on respective sidewalls of the conductive layer 706a.

Referring to FIG. 8C, a conductive layer 814 of the same material as the conductive layer 706a is deposited on the substrate 700. The conductive layer 814 covers, for example, the conductive layer 706a and the conductive layer 812 disposed in the trenches 710. Thereafter, conductive layers 814, 812 and 706a are jointly patterned to form word lines 816, so as to complete the structure of the memory device in an embodiment of the present invention.

In view of the above, the memory device and the methods for fabricating and operating the same in embodiments of the present invention possess at least the following features:

1. The charge storage layers are separated in a single memory cell with the recessed doped regions, so that the second bit effect can be suppressed efficiently and the program disturbance can be avoided.

2. Only a single layer of the gate dielectric layer is disposed above the planer channel region, and thereby gate controllability is able to be improved.

3. Due to the recessed doped regions, junction depth thereof is deeper so as to further alleviate the program disturbance and lower the resistance of the diffusion.

4. The fabrication can be easily incorporated into the current process. Hence, not only the process is simplified without raising the cost, the device performance can also be more effectively improved.

5. The memory device is programmed by directly injecting electrons into the charge storage layer without redirection, so that improved programming efficiency and reduction of the gate voltage can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
a substrate having a plurality of trenches formed therein;
a conductive layer, disposed over the substrate and filling the trenches;
a plurality of charge storage layers, disposed between the substrate and the conductive layer in the trenches respectively, wherein the charge storage layers are separated from each other;
a gate dielectric layer disposed on a surface of the substrate between two adjacent trenches; and
a plurality of doped regions, configured in the substrate under bottoms of the trenches respectively.

2. The memory device according to claim 1, wherein the charge storage layers are only disposed on surfaces of the trenches respectively.

3. The memory device according to claim 1, wherein the charge storage layers further extend in the conductive layer above the substrate.

4. The memory device according to claim 1, wherein the trenches comprises sloped sidewalls.

5. The memory device according to claim 4, wherein an extending direction of the bottoms of the trenches and the sloped sidewalls form an included angle within a range of 45° to 75°.

6. The memory device according to claim 1, wherein a vertical depth of each of the trenches is substantially within a range of 250 angstroms to 350 angstroms.

7. The memory device according to claim 1, wherein the doped regions extend from the bottoms of the trenches to respective sidewalls of each of the trenches respectively.

8. The memory device according to claim 1, wherein a junction of each of the doped regions is apart from a surface of the substrate within a range of 100 angstroms to 200 angstroms.

9. The memory device according to claim 1, wherein the gate dielectric layer further extends in the conductive layer above the trenches.

10. The memory device according to claim 1, further comprising a buried channel configured in the substrate between two adjacent trenches.

11. The memory device according to claim 10, wherein the buried channel is a lightly doped region.

12. The memory device according to claim 11, wherein a dopant dosage of the buried channel is substantially within a range of 3e16 cm$^{-3}$ to 3e17 cm$^{-3}$.

13. The memory device according to claim 10, wherein a vertical depth of the buried channel is substantially within a range of 50 angstroms to 150 angstroms.

14. The memory device according to claim 1, further comprising:
a bottom dielectric layer, disposed between each of the charge storage layers and the substrate; and
a top dielectric layer, disposed between each of the charge storage layers and the conductive layer.

15. A method for operating the memory device as claimed in claim 1, the memory device comprising: a plurality of memory cells, each of the memory cells comprising a first bit and a second bit minor-systematically configured in the charge storage layers respectively neighboring to junctions of two adjacent doped regions on sidewalls of two adjacent trenches, wherein a channel region is configured between the two adjacent doped regions, the method comprising:
when performing a programming operation, applying a first voltage to the conductive layer, applying a second voltage to a doped region adjacent to the first bit, applying a third voltage to another doped region adjacent to the second bit, and applying a fourth voltage to the substrate; and
accelerating carriers to directly inject into the first bit through the channel region,
wherein the first voltage is higher than the fourth voltage, and the second voltage is higher than the third voltage.

16. A method for fabricating a memory device, comprising:
providing a substrate;
forming a plurality of trenches in the substrate;
forming a plurality of doped regions in the substrate under bottoms of the trenches respectively;
forming a plurality of charge storage layers on surfaces of the trenches respectively, wherein the charge storage layers are separated from each other;
forming a conductive layer over the substrate, wherein the conductive layer fills the trenches; and
forming a gate dielectric layer on the surface of the substrate between two adjacent trenches.

17. The method according to claim 15, wherein the first voltage is about 5.5 V to 7.5 V, the second voltage is about 3.5 V to 5.5 V, the third voltage is about 0 V, and the fourth voltage is about 0 V.

18. The method according to claim 17, wherein the step of forming the trenches and the step of forming the doped regions comprises:
forming a pattern layer on the substrate;
removing a portion of the substrate using the pattern layer as a mask to form the trenches, wherein the trenches comprises sloped sidewalls; and
forming the doped regions in the substrate using the pattern layer as a mask.

19. The method according to claim 18, further comprising:
forming spacers on sidewalls of the pattern layer, wherein the spacers cover the sloped sidewalls, and the doped regions are formed by using the pattern layer and the spacers as the mask;
removing the pattern layer and the spacers;
conformally forming a charge storage material layer on the substrate;
removing a portion of the charge storage material layer disposed on a surface of the substrate between two adjacent trenches, so as to form the charge storage layers separated from each other.

20. The method according to claim 19, wherein the gate dielectric layer further extends in the conductive layer above the trenches.

21. The method according to claim 18, further comprising:
framing spacers on sidewalls of the pattern layer, wherein the spacers cover the sloped sidewalls, and the doped regions are formed by using the pattern layer and the spacers as the mask;
removing the spacers;
conformally forming a charge storage material layer on the substrate and on the pattern layer; and
removing a portion of the charge storage material layer disposed on a top surface of the pattern layer, so as to form the charge storage layers remaining on respective sidewalls of the pattern layer,
wherein the pattern layer comprises conductor, and the charge storage material layer is formed after the doped regions are formed.

22. The method according to claim 21, before forming the pattern layer, further comprising forming a gate dielectric layer between the pattern layer and the substrate.

23. The method according to claim 18, further comprising:
conformally forming a charge storage material layer on the substrate and on the pattern layer; and
removing a portion of the charge storage material layer disposed on a top surface of the pattern layer, so as to form the charge storage layers remaining on respective sidewalls of the pattern layer;
wherein the pattern layer comprises conductor, and the doped regions are formed after the charge storage material layer is formed.

24. The method according to claim 23, before forming the pattern layer, further comprising forming a gate dielectric layer between the pattern layer and the substrate.

25. The method according to claim 18, wherein an extending direction of the bottoms of the trenches and the sloped sidewalls form an included angle within a range of 45° to 75°.

26. The method according to claim 17, wherein a vertical depth of each of the trenches is substantially within a range of 250 angstroms to 350 angstroms.

27. The method according to claim 17, further comprising forming a buried channel in the substrate between two adjacent trenches.

28. The method according to claim 27, wherein the buried channel is a lightly doped region.

29. The method according to claim 28, wherein a dopant dosage for forming the buried channel is substantially within a range of 3e16 $cm^{-3}$ to 3e17 $cm^{-3}$.

30. The method according to claim 27, wherein a vertical depth of the buried channel is substantially within a range of 50 angstroms to 150 angstroms.

31. The method according to claim 17, further comprising:
forming a bottom dielectric layer between the charge storage layer and the substrate; and
forming a top dielectric layer between the charge storage layer and the conductive layer.

* * * * *